(12) United States Patent
Vosgueritchian et al.

(10) Patent No.: US 9,886,118 B2
(45) Date of Patent: Feb. 6, 2018

(54) TRANSPARENT FORCE SENSITIVE STRUCTURES IN AN ELECTRONIC DEVICE

(71) Applicant: Apple Inc., Cupertino, CA (US)

(72) Inventors: Michael Vosgueritchian, Cupertino, CA (US); James E. Pedder, Cupertino, CA (US); John Stephen Smith, Cupertino, CA (US); Xiaonan Wen, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 91 days.

(21) Appl. No.: 15/005,256

(22) Filed: Jan. 25, 2016

(65) Prior Publication Data

US 2017/0090638 A1 Mar. 30, 2017

Related U.S. Application Data

(60) Provisional application No. 62/235,238, filed on Sep. 30, 2015.

(51) Int. Cl.
*G06F 3/041* (2006.01)
*H01L 27/12* (2006.01)

(52) U.S. Cl.
CPC .......... *G06F 3/0414* (2013.01); *G06F 3/0412* (2013.01); *G06F 3/0416* (2013.01); *H01L 27/1218* (2013.01); *G06F 2203/04103* (2013.01); *Y10S 977/762* (2013.01)

(58) Field of Classification Search
CPC combination set(s) only.
See application file for complete search history.

(56) References Cited

U.S. PATENT DOCUMENTS

| | | |
|---|---|---|
| 3,876,912 A | 4/1975 | Sanders |
| 4,345,477 A | 8/1982 | Johnson |
| 4,423,640 A | 1/1984 | Jetter |
| 4,516,112 A | 5/1985 | Chen |
| 4,634,917 A | 1/1987 | Dvorsky et al. |
| 4,695,963 A | 9/1987 | Sagisawa |
| 4,951,510 A | 8/1990 | Holm-Kennedy et al. |
| 5,481,905 A | 1/1996 | Pratt |
| 5,673,041 A | 9/1997 | Chatigny et al. |

(Continued)

FOREIGN PATENT DOCUMENTS

| | | |
|---|---|---|
| CN | 1527933 A | 9/2004 |
| CN | 1796955 | 7/2006 |

(Continued)

OTHER PUBLICATIONS

Bau, et al., "TeslaTouch: Electrovibration for Touch Surfaces," UIST'10, Oct. 3-6, 2010, New York, New York, USA, 10 pages.

(Continued)

*Primary Examiner* — Van Chow
(74) *Attorney, Agent, or Firm* — Brownstein Hyatt Farber Schreck, LLP

(57) ABSTRACT

One or more transparent transistor force sensitive structures can be included in an electronic device. The transistor force sensitive structures(s) is used to detect a force that is applied to the electronic device, to a component in the electronic device, and/or to an input region of the electronic device. As one example, the one or more transparent transistor force sensitive structures may be included in a display stack of a display in an electronic device.

25 Claims, 10 Drawing Sheets

(56) References Cited

U.S. PATENT DOCUMENTS

| | | | |
|---|---|---|---|
| 5,708,460 A | 1/1998 | Young | |
| 5,915,285 A | 6/1999 | Sommer | |
| 6,288,829 B1 | 9/2001 | Kimura | |
| 6,369,865 B2 | 4/2002 | Hinata | |
| 6,812,161 B2 * | 11/2004 | Heremans | G02B 6/4249 |
| | | | 257/E33.067 |
| 7,154,481 B2 | 12/2006 | Cross et al. | |
| 7,176,897 B2 | 2/2007 | Roberts | |
| 7,190,350 B2 | 3/2007 | Roberts | |
| 7,196,694 B2 | 3/2007 | Roberts | |
| 7,211,885 B2 | 5/2007 | Nordal et al. | |
| 7,392,716 B2 | 7/2008 | Wilner | |
| 7,441,467 B2 | 10/2008 | Bloom | |
| 7,511,702 B2 | 3/2009 | Hotelling | |
| 7,724,248 B2 | 5/2010 | Saito | |
| 7,755,616 B2 | 7/2010 | Jung et al. | |
| 7,800,592 B2 | 9/2010 | Kerr et al. | |
| 8,020,456 B2 | 9/2011 | Liu et al. | |
| 8,050,876 B2 | 11/2011 | Feen et al. | |
| 8,077,154 B2 | 12/2011 | Emig et al. | |
| 8,243,225 B2 | 8/2012 | Kai et al. | |
| 8,266,971 B1 | 9/2012 | Jones | |
| 8,305,358 B2 | 11/2012 | Klighhult et al. | |
| 8,421,483 B2 | 4/2013 | Klinghult et al. | |
| 8,434,369 B2 | 5/2013 | Hou et al. | |
| 8,456,430 B2 | 6/2013 | Oliver et al. | |
| 8,519,974 B2 | 8/2013 | Berggren | |
| 8,605,053 B2 | 12/2013 | Murphy et al. | |
| 8,648,816 B2 | 2/2014 | Homma et al. | |
| 8,669,952 B2 | 3/2014 | Hashimura et al. | |
| 8,669,962 B2 | 3/2014 | Kuan | |
| 8,692,646 B2 | 4/2014 | Lee et al. | |
| 8,711,128 B2 | 4/2014 | Small et al. | |
| 8,780,060 B2 | 7/2014 | Maschmeyer et al. | |
| 8,780,074 B2 | 7/2014 | Castillo et al. | |
| 8,780,543 B2 | 7/2014 | Molne et al. | |
| 8,870,087 B2 | 10/2014 | Coogan et al. | |
| 8,878,803 B2 | 11/2014 | Kimura et al. | |
| 9,024,910 B2 | 5/2015 | Stephanou et al. | |
| 9,030,427 B2 | 5/2015 | Yasumatsu | |
| 9,063,599 B2 | 6/2015 | Yanagi et al. | |
| 9,081,460 B2 | 7/2015 | Jeong et al. | |
| 9,099,971 B2 | 8/2015 | Lynn et al. | |
| 9,110,532 B2 | 8/2015 | Ando et al. | |
| 9,116,569 B2 | 8/2015 | Stacy et al. | |
| 9,116,570 B2 | 8/2015 | Lee et al. | |
| 9,182,849 B2 | 11/2015 | Huang et al. | |
| 9,182,859 B2 | 11/2015 | Coulson et al. | |
| 9,223,162 B2 | 12/2015 | DeForest et al. | |
| 9,262,002 B2 | 2/2016 | Momeyer et al. | |
| 9,304,348 B2 | 4/2016 | Jang | |
| 9,383,848 B2 | 7/2016 | Daghigh | |
| 9,417,696 B2 | 8/2016 | DeLuca | |
| 9,417,725 B1 | 8/2016 | Watazu et al. | |
| 9,454,268 B2 | 9/2016 | Badaye et al. | |
| 9,466,783 B2 | 10/2016 | Olien et al. | |
| 9,507,456 B2 | 11/2016 | Watazu et al. | |
| 9,542,028 B2 | 1/2017 | Filiz et al. | |
| 9,612,170 B2 | 4/2017 | Vosgueritchian et al. | |
| 9,658,722 B2 | 5/2017 | Schwartz | |
| 9,665,200 B2 | 5/2017 | Filiz et al. | |
| 9,690,414 B2 | 6/2017 | Kano et al. | |
| 9,729,730 B2 | 8/2017 | Levesque et al. | |
| 2002/0149571 A1 | 10/2002 | Roberts | |
| 2008/0165159 A1 | 7/2008 | Soss et al. | |
| 2008/0218488 A1 | 9/2008 | Yang et al. | |
| 2009/0002199 A1 | 1/2009 | Lainonen et al. | |
| 2009/0189866 A1 | 7/2009 | Haffenden et al. | |
| 2009/0316380 A1 | 12/2009 | Armstrong | |
| 2010/0053116 A1 | 3/2010 | Daverman et al. | |
| 2010/0103115 A1 | 4/2010 | Hainzl | |
| 2010/0117809 A1 | 5/2010 | Dai et al. | |
| 2011/0045285 A1 | 2/2011 | Saiki et al. | |
| 2011/0248839 A1 | 10/2011 | Kwok et al. | |
| 2011/0261021 A1 | 10/2011 | Modarres et al. | |
| 2011/0285660 A1 | 11/2011 | Prabhu et al. | |
| 2012/0038577 A1 | 2/2012 | Brown et al. | |
| 2012/0105367 A1 | 5/2012 | Son et al. | |
| 2012/0127136 A1 | 5/2012 | Schneider et al. | |
| 2012/0154299 A1 | 6/2012 | Hsu et al. | |
| 2012/0139864 A1 | 7/2012 | Sleeman et al. | |
| 2012/0188198 A1 | 7/2012 | Jeong et al. | |
| 2012/0293491 A1 | 11/2012 | Wang et al. | |
| 2013/0074988 A1 | 3/2013 | Chou | |
| 2013/0082970 A1 | 4/2013 | Frey et al. | |
| 2013/0141365 A1 | 6/2013 | Lynn et al. | |
| 2013/0147739 A1 | 6/2013 | Aberg et al. | |
| 2013/0154933 A1 | 6/2013 | Sheik-Nainar | |
| 2013/0215056 A1 | 8/2013 | Johansson et al. | |
| 2013/0328803 A1 | 12/2013 | Fukushima et al. | |
| 2013/0333922 A1 | 12/2013 | Kai et al. | |
| 2014/0118635 A1 | 5/2014 | Yang | |
| 2014/0174190 A1 | 6/2014 | Kulkarni et al. | |
| 2014/0191973 A1 | 7/2014 | Zellers et al. | |
| 2015/0002452 A1 | 1/2015 | Klinghult | |
| 2015/0101849 A1 | 4/2015 | Bockmeyer et al. | |
| 2015/0116260 A1 | 4/2015 | Hoen et al. | |
| 2015/0268725 A1 | 9/2015 | Levesque et al. | |
| 2015/0301684 A1 | 10/2015 | Shimamura | |
| 2015/0331517 A1 | 11/2015 | Filiz et al. | |
| 2016/0033389 A1 | 2/2016 | Serpe | |
| 2016/0034073 A1 | 2/2016 | Andoh | |
| 2016/0035290 A1 | 2/2016 | Kim et al. | |
| 2016/0041672 A1 | 2/2016 | Hoen et al. | |
| 2016/0048266 A1 | 2/2016 | Smith et al. | |
| 2016/0062517 A1 | 3/2016 | Meyer et al. | |
| 2016/0132151 A1 | 5/2016 | Watazu et al. | |
| 2016/0147353 A1 | 5/2016 | Filiz et al. | |
| 2016/0306481 A1 | 10/2016 | Filiz et al. | |
| 2016/0357297 A1 | 12/2016 | Picciotto et al. | |
| 2017/0031495 A1 | 2/2017 | Smith | |
| 2017/0075465 A1 | 3/2017 | Pedder et al. | |
| 2017/0090655 A1 | 3/2017 | Zhang et al. | |
| 2017/0191884 A1 | 7/2017 | Vosgueritchian et al. | |
| 2017/0261387 A1 | 9/2017 | Vosgueritchian et al. | |
| 2017/0269757 A1 | 9/2017 | Filiz et al. | |
| 2017/0285864 A1 | 10/2017 | Pedder et al. | |

FOREIGN PATENT DOCUMENTS

| | | |
|---|---|---|
| CN | 1860432 | 11/2006 |
| CN | 101017419 | 8/2007 |
| CN | 101071354 | 11/2007 |
| CN | 101201277 A | 6/2008 |
| CN | 101950224 | 1/2011 |
| CN | 102012772 | 4/2011 |
| CN | 102165400 | 8/2011 |
| CN | 102175362 A | 9/2011 |
| CN | 102460351 | 5/2012 |
| CN | 102591519 | 7/2012 |
| CN | 102822779 | 12/2012 |
| CN | 103026327 | 4/2013 |
| CN | 103069365 | 4/2013 |
| CN | 103197821 | 7/2013 |
| CN | 103336562 | 10/2013 |
| CN | 103582807 | 2/2014 |
| CN | 204461655 U | 7/2015 |
| CN | 204576454 U | 8/2015 |
| CN | 105444662 | 3/2016 |
| EP | 0332365 | 9/1989 |
| EP | 0467562 | 1/1992 |
| EP | 1840714 | 10/2007 |
| EP | 2120136 | 11/2009 |
| EP | 2381340 | 10/2011 |
| EP | 2629075 | 8/2013 |
| FR | 2907563 | 4/2008 |
| JP | 201039458 A | 2/2010 |
| JP | 2010197066 | 9/2010 |
| WO | WO 96/038833 | 12/1996 |
| WO | WO 02/035461 | 5/2002 |
| WO | WO 07/074800 | 7/2007 |
| WO | WO 11/156447 | 12/2011 |
| WO | WO 12/168892 | 12/2012 |
| WO | WO 13/177322 | 11/2013 |

(56) References Cited

FOREIGN PATENT DOCUMENTS

| WO | WO 15/106183 | 7/2015 |
|---|---|---|
| WO | WO 15/158952 | 10/2015 |
| WO | WO 16/029354 | 3/2016 |

OTHER PUBLICATIONS

Feist, "Samsung snags patent for new pressure sensitive touch-screens," posted on AndroidAuthority.com at URL: http://www.androidauthority.com/samsung-patent-pressure-sensitive-touch-screens-354860, Mar. 7, 2014, 1 page.

Rausch, "Printed piezoresistive strain sensors for monitoring of light-weight structures," SENSOR+TEST Conferences 2011—SENSOR Proceedings, pp. 216-220.

Schweizer, "Electrical characterization and investigation of the piezoresistive effect of PEDOT:PSS thin films," A Thesis Presented to the Academic Faculty in Partial Fulfillment of the Requirements for the Degree Master of Science of Electrical and Computer Engineering, Georgia Institute of Technology, Apr. 2005, 89 pages.

Takamatsu, et al., "Transparent conductive-polymer strain sensors for touch input sheets of flexible displays," *Journal of Micromechanics and Microengineering*, vol. 20, 2010, 6 pages.

Tsai, et al., "Fabrication of Graphene-based Micro Strain Gauge," NPL Management Ltd.—Internal, Oct. 15-16, 2012, 1 page.

* cited by examiner

US 9,886,118 B2

TRANSPARENT FORCE SENSITIVE STRUCTURES IN AN ELECTRONIC DEVICE

CROSS-REFERENCE TO RELATED APPLICATION(S)

This application claims the benefit under 35 U.S.C. § 119(e) of U.S. Provisional Patent Application No. 62/235,238, filed on Sep. 30, 2015, and entitled "Transparent Force Sensitive Structures in an Electronic Device," which is incorporated by reference as if fully disclosed herein.

FIELD

Embodiments described herein generally relate to electronic devices. More particularly, the present embodiments relate to one or more transparent force sensitive structures in an electronic device.

BACKGROUND

Strain gauges are used to detect or measure strain on an object. Typically, the electrical resistance of a conventional strain gauge varies in proportion to the compression and tension forces it is experiencing. The gauge factor of the strain gauge represents the sensitivity of the material to strain. In other words, the gauge factor indicates how much the resistance of the strain gauge changes with strain. The higher the gauge factor, the larger the change in resistance. Higher gauge factors allow a greater range of strain to be detected and measured.

In some situations, it is desirable for a strain gauge to be made of a transparent material. For example, transparent strain gauges may be used when the strain gauges are located in an area where the strain gauges can be detected visually by a user (e.g., though a display). However, some of the materials that can be used to form a transparent strain gauge create a transparent strain gauge that has an undesirably low gauge factor.

SUMMARY

One or more optically transparent transistor force sensitive structures can be included in an electronic device. As used herein, the terms "optically transparent" and "transparent" are defined broadly to include a material that is transparent, translucent, or not visually discernible by the human eye. The one or more transistor force sensitive structures can each include a thin-film transistor force sensitive structure. In one embodiment, a gate signal is applied to a gate electrode of the transparent transistor force sensitive structures(s) to adjust the gauge factor of the transistor force sensitive structures (s). In another embodiment, a transistor force sensitive structures includes a transparent piezotronic transistor force sensitive structures that utilizes the piezo-polarization charges at an interface between a semiconducting layer and one or more conductive electrodes to control the transport of charge carriers across the contact barrier.

The one or more transparent transistor force sensitive structures are used to detect a force that is applied to the electronic device, to a component in the electronic device, such as an input button, and/or to an input region or surface of the electronic device. In one non-limiting example, a force sensor that includes one or more optically transparent transistor force sensitive structures may be incorporated into a display stack of an electronic device. In some embodiments, the one or more transparent force sensitive structures are located in an area of the display stack that is associated with the viewable area of the display. As such, the force sensitive structures are transparent so a user is not able (or is less able) to detect the force sensitive structures when the user is viewing the display.

In one aspect, an electronic device includes a cover layer configured to receive at least one touch input, a display layer positioned below the cover layer, and a force layer positioned below the cover layer. In one embodiment, the display layer is positioned between the cover layer and the force layer. In another embodiment, the force layer is positioned between the cover layer and the display layer. The force layer is configured to detect strain based on the at least one force input. The force layer may include a first plurality of transparent transistor force sensitive structures positioned over a first surface of a transparent substrate and at least one first gate contact electrically connected to each transparent transistor force sensitive structure in the first plurality of transparent transistor force sensitive structures. The at least one first gate contact is configured to receive a first gate signal to adjust a gauge factor of at least one transistor force sensitive structure in the first plurality of transparent transistor force sensitive structures. A processing device is configured to receive strain signals from the first plurality of transparent transistor force sensitive structures and configured to estimate an amount of force associated with each touch input.

In another aspect, the transparent force layer can include a first plurality of transparent piezotronic transistor force sensitive structures positioned over a first surface of a transparent substrate. A processing device is configured to receive strain signals from the first plurality of transparent piezotronic transistor force sensitive structures and configured to estimate an amount of force associated with each touch input.

In another aspect, the transparent force layer may include one or more transparent transistor force sensitive structures that each include a first gate electrode positioned over a first semiconducting layer, a first source electrode at least partially positioned on a surface of the first semiconducting layer below the first gate electrode, a first drain electrode at least partially positioned on the surface of the first semiconducting layer below the first gate electrode, a first strain signal line connected to the source electrode, and a second strain signal line connected to the drain electrode. A first gate contact is electrically connected to the first gate electrode in at least one transparent transistor force sensitive structure. The first gate contact is configured to receive a first gate signal to adjust a gauge factor of the at least one transparent transistor force sensitive structure.

In yet another aspect, a method for producing an electronic device can include providing a display layer below the cover layer, and providing a force layer below the cover layer. The cover layer is configured to receive at least one touch input, and the force layer is configured to detect strain based on the at least one touch input. The force layer may include a first set of transparent transistor force sensitive structures positioned over a first surface of a transparent substrate. Each transparent transistor force sensitive structure includes a conductive electrode positioned over a transparent semiconducting layer. A processing device is provided that is configured to receive strain signals from the first set of transparent transistor force sensitive structures and configured to estimate an amount of force associated with each touch input.

In yet another aspect, a method of operating a transistor force sensitive structure may include receiving data from one or more electronic components in an electrical device, determining an operating state or condition of the electronic device based on the received data, and adjusting a force threshold based on the determined operating state or condition. The force threshold is associated with a force layer that includes at least one transparent transistor force sensitive structure. An example electronic component includes, but is not limited to, a motion sensor, a light sensor, an image sensor, a clock, and an application program.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
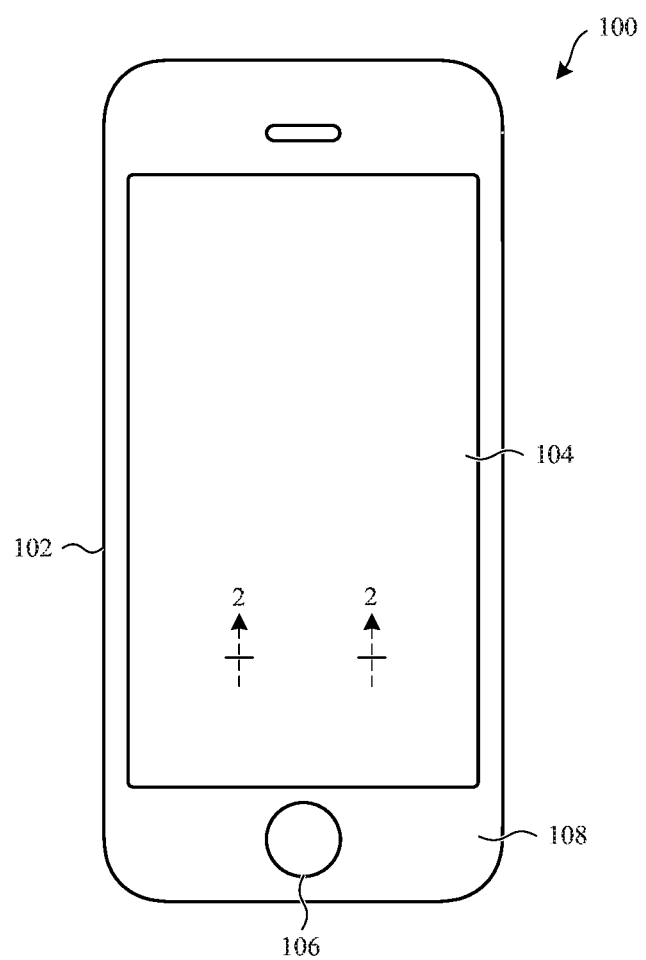
FIG. 1 shows one example of an electronic device that can include one or more transparent force sensitive structures.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to an electronic device that includes one or more optically transparent force sensitive structures configured to detect strain based on an amount of force applied to the electronic device, a component in the electronic device, and/or an input region of the electronic device. As one example, the one or more transparent force sensitive structures can be incorporated into a display stack of an electronic device and at least a portion of the top surface of the display screen may be an input region. In some embodiments, the one or more transparent force sensitive structures are located in an area of the display stack that is associated with the viewable area of the display. As such, the force sensitive structures are transparent so a user is not able (or is less able) to detect the force sensitive structures when the user is viewing the display. As used herein, the terms "optically transparent" and "transparent" are defined broadly to include a material that is transparent, translucent, or not visibly discernible by the human eye.

The one or more optically transparent force sensitive structures can each include a thin film transistor force sensitive structure. In some embodiments, the gauge factor of a transistor force sensitive structure is a function of the free carrier concentration or mobility in an optically transparent thin film semiconducting layer. Low carrier concentration can produce a higher gauge factor in a transistor force sensitive structure. A gate signal is applied to a gate electrode of the transistor force sensitive structure to alter the number of free carriers in the semiconducting layer. For example, the gate signal may deplete the semiconducting layer of free carriers, which effectively increases the gauge factor of the transistor force sensitive structure.

In other embodiments, the transistor force sensitive structure(s) is a piezotronic transistor force sensitive structure that utilizes the piezo-polarization charges at an interface between a semiconducting layer and a conductive electrode to control the transport of charge carriers across contact barriers. In particular, the interfaces between a semiconducting layer and two conductive electrodes each form a Schottky contact or barrier to charge injection and collection. The barriers are dependent on the energetics of both the semiconducting layer and the two electrodes. Since the material in the semiconducting layer is piezoelectric, an electric potential ("piezopotential") is produced in the semiconducting layer as the force or applied strain on the semiconducting layer changes. This piezopotential results from the polarization of the non-mobile charge carriers in the semiconducting layer. The charge carrier transport process across the Schottky barrier can be controlled by the changes in polarization.

In a piezotronic transistor force sensitive structure, the conductive electrodes are positioned on the polar surfaces of the semiconducting layer. During a compressive strain, negative charges are induced at an interface between the semiconducting layer and a source electrode (at one polar surface of the semiconducting layer) and positive charges are induced at the interface between the semiconducting layer and a drain electrode (the other polar surface of the semiconducting layer). The negative charges increase the barrier height, making it harder to inject carriers into the semiconducting layer. In a transistor architecture, the increased barrier height translates to a decrease in the source-drain current. Conversely, during a tensile strain the polarities of the induced charges switch, which decreases the barrier height. In a transistor architecture, the lower barrier height translates to an increase in the source-drain current. The change in the source-drain current is measured and correlated to an amount of strain.

Directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting. When used in conjunction with layers of a display or device, the directional terminology is intended to be construed broadly, and therefore should not be interpreted to preclude the presence of one or more intervening layers or other intervening features or elements. Thus, a given layer that is described as being formed, positioned, disposed on or over another layer, or that is described as being formed, positioned, disposed below or under another layer may be separated from the latter layer by one or more additional layers or elements.

These and other embodiments are discussed below with reference to FIGS. 1-13. However, those skilled in the art will readily appreciate that the detailed description given herein with respect to these Figures is for explanatory purposes only and should not be construed as limiting.

FIG. 1 shows one example of an electronic device that can include one or more transparent force sensitive structures. In the illustrated embodiment, the electronic device 100 is implemented as a smart telephone. Other embodiments can implement the electronic device differently. For example, an electronic device can be a laptop computer, a tablet computing device, a wearable computing device such as a smart watch or a health assistant, a digital music player, a display input device, a remote control device, and other types of electronic devices that include a force sensitive structure or structures.

The electronic device 100 includes an enclosure 102 surrounding a display 104 and one or more input/output (I/O) devices 106 (shown as button). The enclosure 102 can form an outer surface or partial outer surface for the internal components of the electronic device 100, and may at least partially surround the display 104. The enclosure 102 can be formed of one or more components operably connected together, such as a front piece and a back piece. Alternatively, the enclosure 102 can be formed of a single piece operably connected to the display 104.

The display 104 can provide a visual output for the electronic device 100 and/or function to receive user inputs to the electronic device. For example, the display 104 can be a multi-touch capacitive sensing touchscreen that can detect one or more user touch and/or force inputs. The display 104 may be substantially any size and may be positioned substantially anywhere on the electronic device 100. The display 104 can be implemented with any suitable display, including, but not limited to, a multi-touch sensing touchscreen device that uses liquid crystal display (LCD) technology, light emitting diode (LED) technology, organic light-emitting display (OLED) technology, or organic electro luminescence (OEL) technology.

In some embodiments, the I/O device 106 can take the form of a home button, which may be a mechanical button, a soft button (e.g., a button that does not physically move but still accepts inputs), an icon or image on a display, and so on. Further, in some embodiments, the button can be integrated as part of a cover layer of the electronic device. Although not shown in FIG. 1, the electronic device 100 can include other types of I/O devices, such as a microphone, a speaker, a camera, and one or more ports such as a network communication port and/or a power cord port.

A cover layer 108 may be positioned over the front surface of the electronic device 100. One or more portions of the cover layer 108 can function as an input region and receive touch and/or force inputs. For example, the portion of the cover layer 108 overlying the display 104 can receive touch and/or force inputs. In one embodiment, the cover layer 108 may cover the entire front surface of the electronic device. In another embodiment, the cover layer 108 can cover the display 104 but not the I/O device 106. In such embodiments, the I/O device 106 may be positioned in an opening or aperture formed in the cover layer 108.

Force sensitive structures can be included in one or more locations of the electronic device 100. For example, in one embodiment one or more force sensitive structures may be included in the I/O device 106. The strain sensor(s) can be used to measure an amount of force and/or a change in force that is applied to the I/O device 106. Additionally or alternatively, one or more force sensitive structures can be positioned under at least a portion of the enclosure to detect a force and/or a change in force that is applied to the enclosure. Additionally or alternatively, one or more force sensitive structures may be included in a display stack of the display 104. The force sensitive structures(s) can be used to measure an amount of force and/or a change in force that is applied to the display or to a portion of the display. FIGS. 2-12 are described in conjunction with a display stack.

Figure 2:
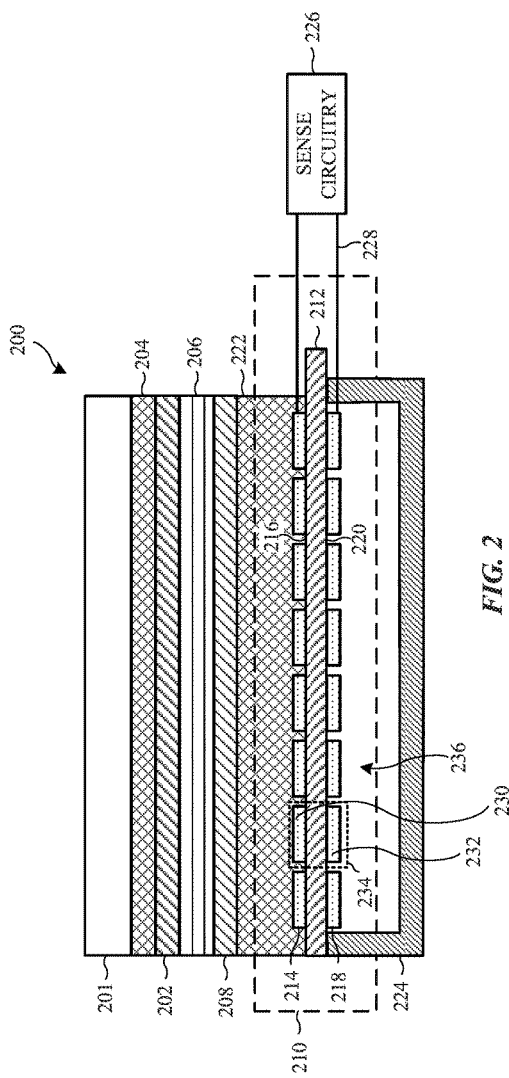
FIG. 2 shows a cross-sectional view of the display taken along line 2-2 in FIG. 1.

As described earlier, in one non-limiting example the entire top surface of a display (or the cover layer disposed over the top surface of the display) may be an input region that is configured to receive touch and/or force inputs from a user. A force layer that includes one or more force sensitive structures can be included in a display stack of a display (e.g., display 104 in FIG. 1). FIG. 2 shows a cross-sectional view of the display taken along line 2-2 in FIG. 1. The display stack 200 includes a cover layer 201 positioned over a front polarizer 202. The cover layer 201 can be a flexible touchable surface that is made of any suitable material, such as, for example, glass, plastic, sapphire, or combinations thereof. The cover layer 201 can act as an input region for a touch sensor and/or a force sensor by receiving touch and force inputs from a user. The user can touch and/or apply force to the cover layer 201 with one or more fingers or with another element, such as a stylus.

An adhesive layer 204 can be disposed between the cover layer 201 and the front polarizer 202. Any suitable adhesive can be used for the adhesive layer, such as, for example, an optically clear adhesive. A display layer 206 can be positioned below the front polarizer 202. As described previously, the display layer 206 may take a variety of forms, including a liquid crystal display (LCD), a light-emitting diode (LED) display, and an organic light-emitting diode (OLED) display. In some embodiments, the display layer 206 can be formed from glass or have a glass substrate. Embodiments described herein include a multi-touch touchscreen LCD display layer.

Additionally, the display layer 206 can include one or more layers. For example, a display layer 206 can include a VCOM buffer layer, a LCD display layer, and a conductive layer disposed over and/or under the display layer. In one embodiment, the conductive layer may comprise an indium tin oxide layer.

A rear polarizer 208 may be positioned below the display layer 206, and a force layer 210 below the rear polarizer 208. The force layer 210 includes a substrate 212 having a first set of independent transparent force sensitive structures 214 on a first surface 216 of the substrate 212 and a second set of independent transparent force sensitive structures 218 on a second surface 220 of the substrate 212. The first and second sets of independent transparent force sensitive structures can each include one or more transparent force sensitive structures. In the illustrated embodiment, the one or more transparent force sensitive structures are located in an area of the display stack that is associated with the viewable area of the display. As such, the force sensitive structures are transparent so a user is not able (or is less able) to detect the force sensitive structures when the user is viewing the display. In the illustrated embodiment, the first and second surfaces 216, 220 are opposing top and bottom surfaces of the substrate 212, respectively. An adhesive layer 222 may attach the substrate 212 to the rear polarizer 208.

A back light unit 224 can be disposed below (e.g., attached to) the force layer 210. The back light unit 224 may be configured to support one or more portions of the substrate 212 that do not include transparent force sensitive structures. For example, as shown in FIG. 2, the back light unit 224 can support the ends of the substrate 212. Other embodiments may configure a back light unit differently.

The force sensitive structures are typically connected to sense circuitry 226 through conductive connectors 228. The sense circuitry 226 is configured to receive a strain signal and/or to detect changes in a strain signal received from each force sensitive structure. The strain signals can be correlated to an amount of force that is applied to the cover layer 201. In some embodiments, the sense circuitry 226 may also be configured to provide information about the location of a touch based on the relative difference in the change of an electrical property of the transparent force sensitive structures 214, 218. Collectively, the force layer 210 and the sense circuitry 226 operably connected to the force sensitive structures form a force sensor in one embodiment. In other embodiments, a force layer, the sense circuitry, and a processing device operably connected to the sense circuitry form a force sensor.

In the illustrated embodiment, a gap 236 exists between the force layer 210 and the back light unit 224. Strain measurements intrinsically measure the force at a point on the first surface 216 of the substrate 212 plus the force from the bottom at that point on the second surface 220 of the substrate 212. When the gap 236 is present, there are no forces on the second surface 220. Thus, the forces on the first surface 216 can be measured independently of the forces on the second surface 220. In alternate embodiments, the force layer 210 may be positioned above the display layer 206. For example, the force layer 210 may be positioned above the display layer 206 when the display stack 200 does not include the gap 236.

Other embodiments can configure a force layer differently. For example, a force layer can include only one set of transparent force sensitive structures on a surface of the substrate. A processing device may be configured to determine an amount of force, or a change in force, applied to an input region based on signals received from the one set of transparent force sensitive structures. Additionally or alternatively, the force layer 210 may be positioned above the display layer 206 in other embodiments.

Figure 3:
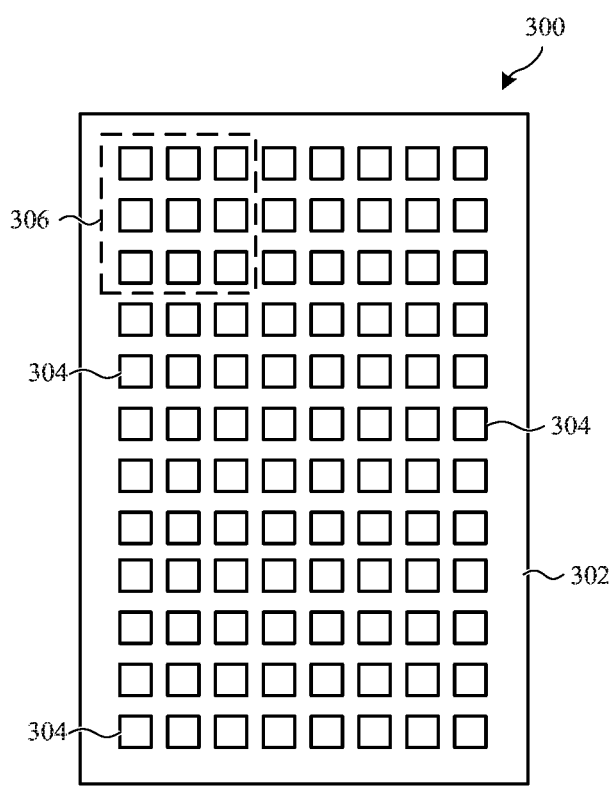
FIG. 3 shows a plan view of an example transparent force layer that is suitable for use in a display stack.

FIG. 3 shows a plan view of an example transparent force layer that is suitable for use in a display stack. The force layer 300 can include a grid of independent optically transparent force sensitive structures 304 formed in or on a substrate 302. The transparent force sensitive structures 304 may be formed in or on at least a portion of one or both surfaces of the substrate 302. In this example, the transparent force sensitive structures 304 are formed as an array of rectilinear sensing elements, although other shapes and array patterns can also be used. The substrate 302 can be formed of any suitable material or materials. In one embodiment, the substrate 302 is formed with an optically transparent material, such as glass, a polymer resin (e.g., polyethylene terephthalate (PET), or a plastic.

Figure 4:
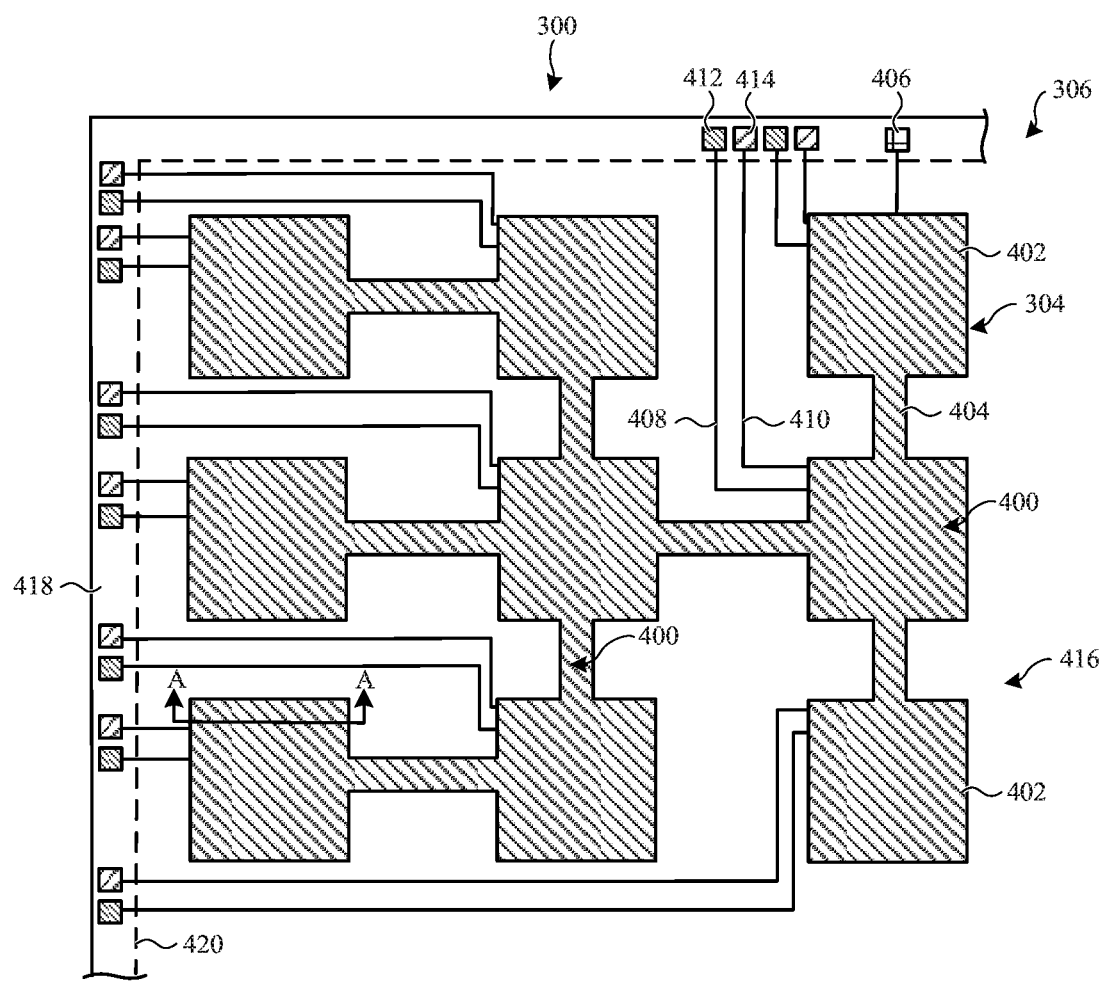
FIG. 4 shows an enlarged plan view of the area 306 shown in FIG. 3.

FIG. 4 shows an enlarged plan view of the area 306 shown in FIG. 3. An optically transparent conductive gate layer 400 includes gate electrodes 402 and connecting sections 404. Each gate electrode 402 is included in a transparent force sensitive structure 304. The conductive gate layer 400 is electrically connected to one or more gate contacts 406. A gate signal (e.g., voltage) is applied to the conductive gate layer 400 through gate contact(s) 406. In the illustrated embodiment, each gate electrode 402 receives the gate signal because all of the gate electrodes 402 are electrically connected to each other by connecting sections 404.

In other embodiments, a force layer can include multiple gate contacts and individual gate electrodes 402. Each gate contact 406 may be electrically connected to a single gate electrode 402 or to a group of gate electrodes 402. Alternatively, in some embodiments a force layer can include multiple gate contacts 406 and distinct groups of gate electrodes 402. The gate electrodes in each group of gate electrodes may be electrically connected together by connecting sections. A gate contact 406 may be electrically connected to each group of gate electrodes 402 in the force layer.

Returning to FIG. 4, a first strain signal line 408 and a second strain signal line 410 electrically connects each force sensitive structure 304 to first and second source-drain contacts 412, 414, respectively. A bias signal (e.g., voltage) is applied to the first source-drain contact(s) and a strain signal is received at the second source-drain contact(s) when a force is applied to an input region of the electronic device (e.g., the cover layer 108 disposed over the display 104 in FIG. 1). The strain signals are received by a processing device (not shown) that correlates at least one strain signal to an amount of force (or a change in force) applied to the input region of the electronic device.

In the illustrated embodiment, the force layer 300 includes a display area 416 and a non-display area 418. The display area 416 is an area of the display stack that is associated with the viewable section of the display. The non-display area 418 is associated with an area of the display that does not provide an output (e.g., image) to the user when the user is viewing the display. In other words, the display area 416 is in the optical path of the display and/or back light unit, while the non-display area 418 is outside of the optical path of the display and/or back light unit.

The dashed line 420 illustrates an example boundary between the display and non-display areas 416, 418 of the force layer 300. In one embodiment, the transparent force sensitive structures 304 and the strain signal lines 408, 410 are disposed in the display area 416 and the gate and source-drain contacts 406, 412, 414 are positioned in the non-display area 418. As such, the transparent force sensitive structures 304 and the strain signal lines 408, 410 are formed with an optical transparent material or materials. In some embodiments, the gate and source-drain contacts 406, 412, 414 are also formed with an optically transparent material. However, when the gate and source-drain contacts 406, 412, 414 are located in the non-display area 418, the gate and source-drain contacts 406, 412, 414 can be formed with an opaque material or materials, including, but not limited to, a metal.

Figure 5:
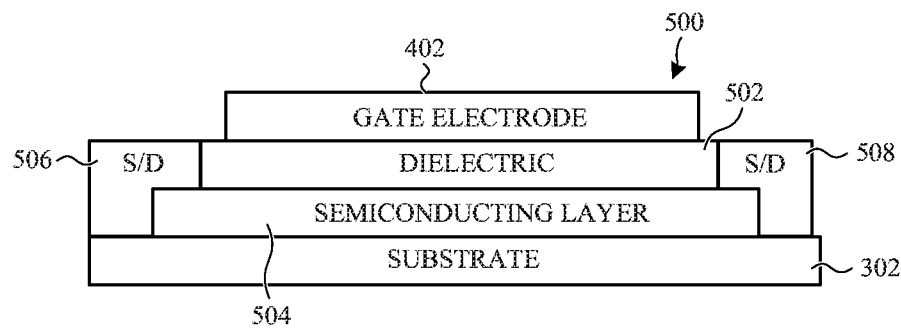
FIG. 5 shows a simplified cross-sectional view taken along line A-A in FIG. 4 of a first transparent force sensitive structure that is suitable for use in the force layer shown in FIG. 3.

FIG. 5 shows a simplified cross-sectional view taken along line A-A in FIG. 4 of a first transparent force sensitive structure that is suitable for use in the force layer shown in FIG. 3. The transparent force sensitive structure 500 is constructed as an optically transparent thin-film transistor force sensitive structure that includes the gate electrode 402. A dielectric layer 502 is positioned below the gate electrode 402. The dielectric layer 502 can be formed with any suitable dielectric material. One example dielectric material is silicon dioxide.

The gauge factor of the transistor force sensitive structure 500 is a function of the free carrier concentration or mobility in an optically transparent thin film semiconducting layer 504. A low carrier concentration can produce a higher gauge factor in a transistor force sensitive structure. A gate signal is applied to the gate electrode 402 (via gate contact 406 in FIG. 4) to alter the number of free carriers in the semiconducting layer 504. For example, the gate signal may deplete the semiconducting layer 504 of free carriers, which effectively increases the gauge factor of the transistor force sensitive structure. As described earlier, the gauge factor of a force sensitive structure represents the sensitivity of the material to strain. The higher the gauge factor, the larger the change in resistance. A higher gauge factor produces a force sensitive structure that is more sensitive to strain, which may allow a greater range of strain to be detected and measured.

In the illustrated embodiment, the optically transparent thin film semiconducting layer 504 is positioned below the dielectric layer 502 and over the substrate 302. Example transparent semiconducting materials include, but are not limited to, silver nanowires or a semiconducting oxide such as indium tin oxide (ITO) or zinc oxide (ZnO). In the illustrated embodiment, a first source-drain (S/D) electrode 506 and a second source-drain (S/D) electrode 508 are positioned on either side of the semiconducting layer 504 and directly contact at least one surface of the semiconducting layer 504. In a non-limiting example, the first S/D electrode 506 is a source electrode and the second S/D electrode 508 is a drain electrode (or vice versa). Although not shown in FIG. 5, a strain signal line (e.g., first strain signal line 408 in FIG. 4) is electrically connected to one S/D electrode (e.g., S/D electrode 506) and another strain signal line (e.g., second strain signal line 410) is electrically connected to the S/D electrode (e.g., S/D electrode 508).

Other embodiments can construct the thin-film transistor force sensitive structure differently. For example, the first and second source-drain electrodes 506, 508 can be positioned on a surface of the semiconducting layer 504 within openings formed in the dielectric layer 502.

To determine a force measurement, a constant gate signal may be applied to the gate electrode 402 to produce an electric field and deplete the semiconducting layer 504 of free carriers, which can increase the gauge factor of the transistor force sensitive structure 500. A constant source/drain signal is applied to the source electrode (e.g., S/D electrode 506), and a strain signal is received from the drain electrode (e.g., S/D electrode 508). The strain signal represents an amount of strain imposed on the transistor force sensitive structure 500. A processing device (not shown) can receive the strain signal from the transistor force sensitive structure 500 and correlate the strain signal to the amount of force applied to an input region (e.g., the cover layer 108 over the display 104 in FIG. 1).

The semiconducting layer 504 can be formed in any suitable shape and with any given dimensions. For example, a semiconducting layer can be formed in a serpentine shape. In other embodiments, the semiconducting layer can have a different shape and/or different dimensions. In a non-limiting embodiment, the semiconducting layer may not be patterned into a given shape.

Figure 6:
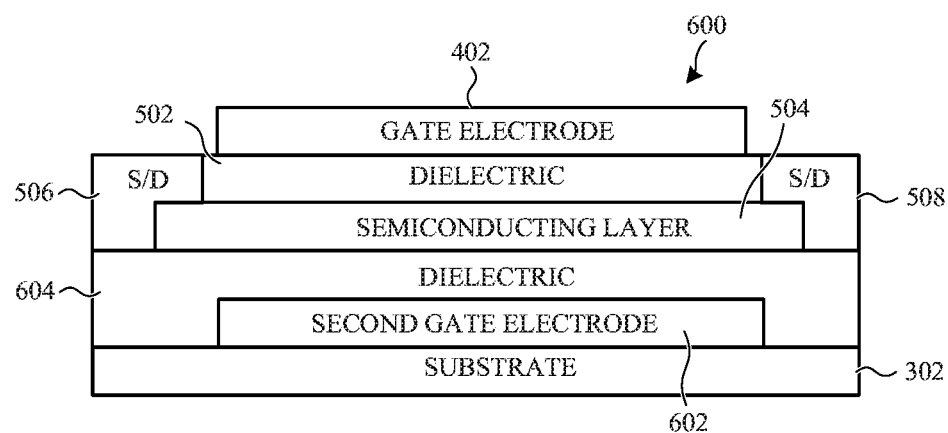
FIG. 6 shows a simplified cross-sectional view taken along line A-A in FIG. 4 of a second transparent force sensitive structure that is suitable for use in the force layer shown in FIG. 3.

FIG. 6 shows a simplified cross-sectional view taken along line A-A in FIG. 4 of a second transparent force sensitive structure that is suitable for use in the force layer shown in FIG. 3. The second transparent force sensitive structure 600 is similar to the thin-film transistor force sensitive structure 500 shown in FIG. 5, with the addition of a second gate electrode 602. Thus, the transistor force sensitive structure 600 is a dual gate electrode transistor force sensitive structure that includes the first gate electrode 402 and the second gate electrode 602.

A second dielectric layer 604 is positioned below the first semiconducting layer 504, and the second gate electrode 602 is positioned between the second dielectric layer 604 and the substrate 302. As described earlier, the gauge factor of the transistor force sensitive structure 600 is a function of the free carrier concentration or mobility in the semiconducting layer 504. In some situations, a single gate electrode (e.g., gate electrode 402) may not produce a sufficient electric field to adequately change the free carrier concentration in the semiconducting layer 504 to produce a given or desired gauge factor (or a particular range of gauge factors). Thus, in some embodiments the combination of the first and second gate electrodes 402, 602 may generate electric fields that adequately deplete the free carrier concentration in the semiconducting layer 504 and produce a given or desired gauge factor (or a particular range of gauge factors).

The first and second gate electrodes 402, 602 may be formed with the same material(s) or with different materials. In one embodiment, the second gate electrode 602 is included in a second conductive gate layer (not shown) that is similar to the conductive gate layer 400 in FIG. 4. In other embodiments, the second gate electrode 602 is a discrete second gate electrode that is not electrically connected to the second gate electrodes in other force sensitive structures. Additionally, in some embodiments the first and second gate electrodes 402, 602 can be electrically connected to same one or more gate contacts (e.g., gate contact 406 in FIG. 4). In such embodiments, the first and second gate electrodes 402, 602 receive the same gate signal to deplete the semiconducting layer 504. In other embodiments, the first gate electrode 402 can be electrically connected to one or more first gate contacts (e.g., gate contact 406 in FIG. 4) and the second gate electrode 602 may be electrically connected to a different one or more second gate contacts. In such embodiments, the second gate electrode 602 is able to receive a different gate signal (e.g., different signal level) than the gate signal received by the first gate electrode 402.

Figure 7:
FIG. 7 shows a channel width in a semiconducting layer when a gate signal is not applied to a gate electrode.
Figure 8:
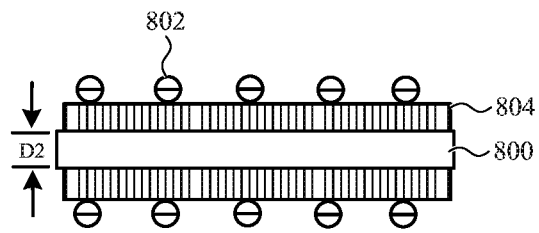
FIG. 8 shows a channel width in the semiconducting layer when a gate signal is applied to a gate electrode.

FIG. 7 shows a channel width in a semiconducting layer when a gate signal is not applied to a gate electrode. In a semiconducting layer, a channel comprises a high conductivity region that connects the source and drain in the transistor. The channel 700 has a width D1 in the absence of a gate signal. As shown in FIG. 8, the channel 800 has a different (narrower) channel width D2 when a gate signal is applied to a gate electrode (e.g., gate electrode 402 in FIG. 5). Charge carriers 802 have been depleted from the semiconducting layer 804, which narrows the channel width from D1 to D2. Because the gauge factor is a function of the free carrier concentration (or mobility), the narrowing of the channel width effectively increases the gauge factor of the transistor force sensitive structure. The amount of change in the channel width (D1 to D2) depends on several factors, including the signal level of the gate signal, the signal level of the bias signal applied to a source/drain electrode, the material used to form the semiconducting layer, the dielectric constant of the dielectric layer, and/or the thickness of the dielectric layer. In some embodiments, one or more of these factors is chosen to customize or tune the amount of charge carrier depletion and produce a given gauge factor or a particular range of gauge factors.

Figure 9:
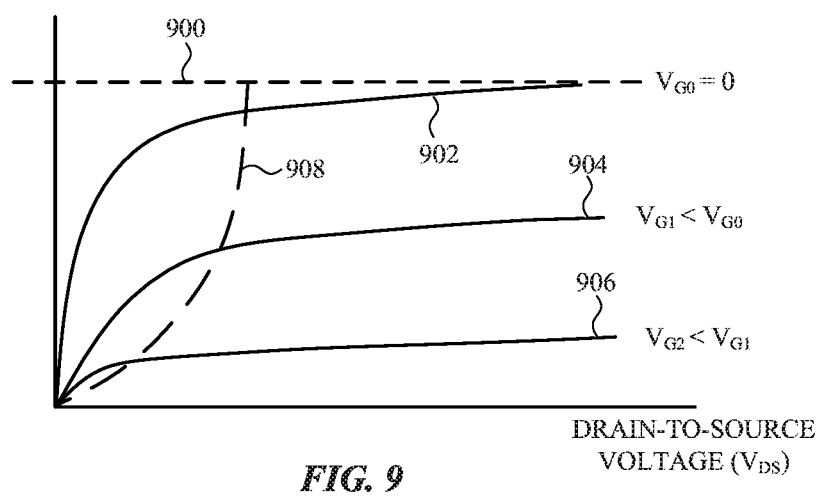
FIG. 9 shows an example plot depicting the effect of a gate signal on the channel width and the source drain current.

FIG. 9 shows example output plots of a transistor force sensitive structure. As shown in FIG. 9, plot 900 represents the maximum output current (drain current $I_D$), which occurs when the gate voltage is zero. Plots 902, 904, and 906 represent various signal levels for $I_D$ based on different gate signals. As shown, $I_D$ decreases as the gate signal becomes more negative.

The decrease in $I_D$ is due at least in part to the narrowing of the conductive channel. The area to the left of line 908 represents the linear region of the transistor force sensitive structure and the area to the right of line 908 the saturation region. In the saturation region, the gate signal does not significantly impact the signal level of $I_D$, which means the gate signal does not significantly vary the width of the conductive channel (e.g., conductive channel has become too narrow). In the linear region, however, the gate signal has a more significant impact on the signal level of $I_D$, which means the gate signal has a noticeable impact on the width of the conductive channel. By operating the transistor force sensitive structure in the linear region, different gate signals can change the gauge factor of the transistor force sensitive structure. This is because the gauge factor is a function of the free carrier concentration (or mobility). When the channel width is wider (e.g., in FIG. 9 when signal level of $I_D$ is higher based on a less negative gate signal), fewer free carriers have been depleted so the number of free carriers is higher, which in turn decreases the gauge factor. Conversely, when the channel width is narrower (e.g., in FIG. 9 when signal level of $I_D$ is lower based on more negative gate signal), more free carriers have been depleted so the number of free carriers is lower, which in turn increases the gauge factor. A higher gauge factor causes the transistor force sensitive structure to be more sensitive to strain, even small strains. This allows the transistor force sensitive structure to detect a greater range of strain.

In some embodiments, the operation of the transparent force sensitive structure(s) shown in FIG. 5 and/or FIG. 6 can be changed dynamically based on the expected force inputs and/or based on data from other electronic components in an electronic device, such as sensors, clocks, and application programs (e.g., a calendar, a navigation program). For example, the amount of change in the channel width can be adjusted (e.g., narrowed) dynamically based on the expected force inputs and/or based on data from other electronic components in an electronic device. A processing device can receive data from a motion sensor (e.g., accelerometer, gyroscope) and determine the electronic device is stationary. The processing device can adjust the gate signal level that is applied to the gate layer to a first gate signal level, which can produce a slightly narrow channel width. With a slightly narrow channel width, a greater amount of force may be needed in order for the force input to be recognized by the processing device. Alternatively, a processing device can receive data from a motion sensor and determine the electronic device is moving. The processing device may adjust the gate signal level to a second gate signal level, which can produce a narrower channel width (more narrow than the channel width produced with the first gate signal level). With the narrower channel width, a lesser amount of force may be needed in order for the force input to be recognized by the processing device.

In another example, a processing device can receive data from a light sensor and determine the electronic device is in a dark environment. Additionally or alternatively, the processing device may receive data from a clock to determine the time of day. The processing device can adjust the gate signal level that is applied to the gate layer to a first gate signal level, which can produce a slightly narrow channel width. With a slightly narrow channel width, a greater amount of force may be needed in order for the force input to be recognized by the processing device.

Figure 10:
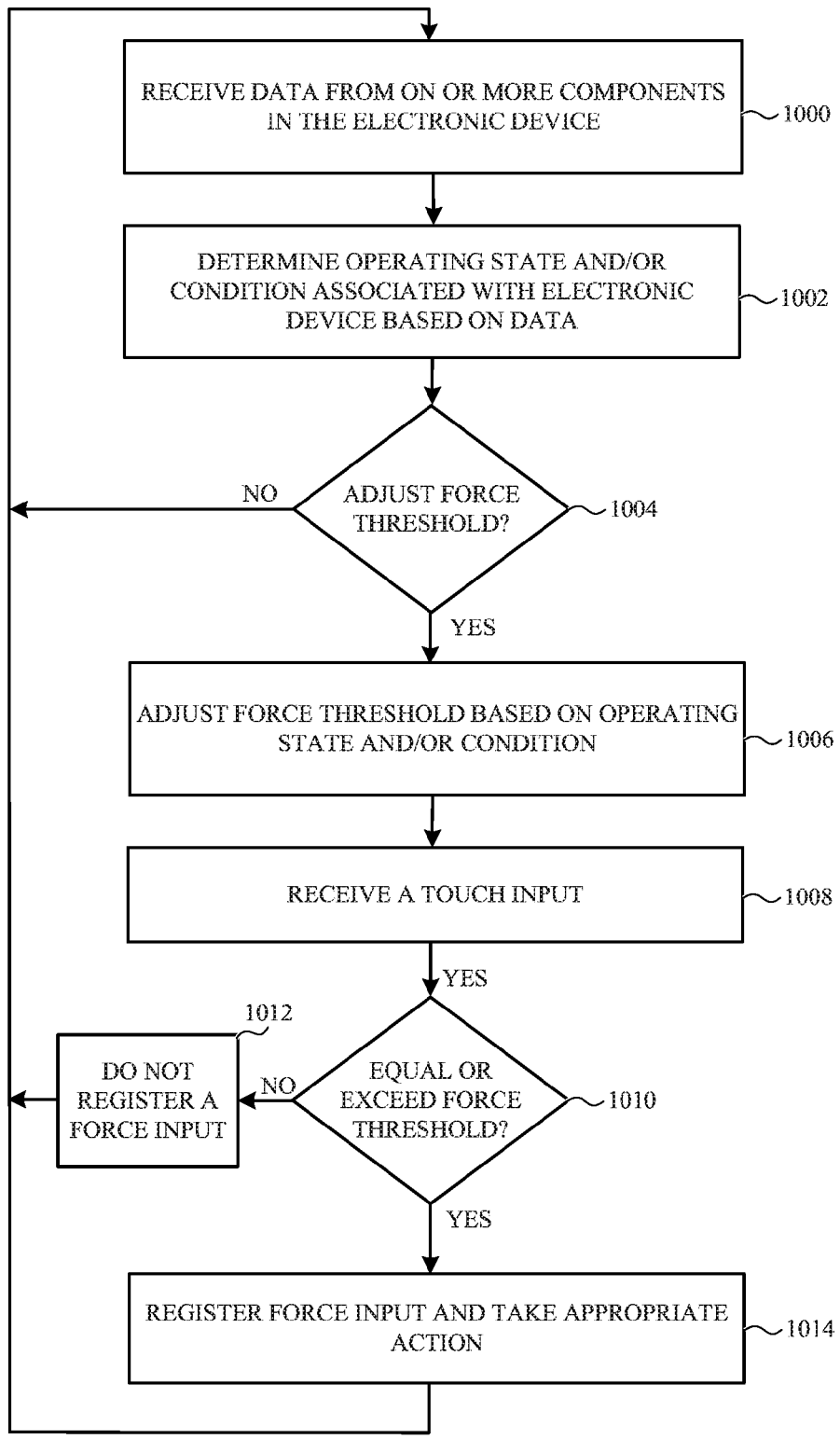
FIG. 10 shows a flowchart of a method for operating an electronic device that includes one or more of the transparent force sensitive structures shown in FIGS. 5 and 6.

FIG. 10 shows a flowchart of a method for operating an electronic device that includes one or more of the transparent force sensitive structures shown in FIGS. 5 and 6. Initially, as shown in block 1000, data is received from one or more electronic components in the electronic device. As described earlier, the electronic component(s) can be a sensor (e.g., accelerometer, light sensor, image sensor), a clock, and/or an application program (e.g., calendar, navigation program). An operating state or condition is then determined based on the data (block 1002). For example, a processing device may be configured to receive the data from the electronic component(s) and determine an operating state or condition based on the data. An example operating state or condition can include movement, the speed or type of movement, the time of day (e.g., a time when a user is sleeping or not interacting with the electronic device), and/or the presence of the electronic device in a dark or unlit environment.

Next, as shown in block 1004, a determination is made as to whether a force threshold is to be adjusted. The force threshold may be adjusted based on the determined operating state or condition. The force threshold can be increased, decreased, or remain the same depending on the operating state or condition. The method returns to block 1000 when the force threshold will not be adjusted. Alternatively, the force threshold is adjusted at block 1006 when the force threshold is to be adjusted.

A touch input is then received at block 1008. When a touch input is received, a determination is made at block 1010 as to whether the force applied during the touch input equals or exceeds the force threshold. A force input is not registered or detected if the applied force does not equal or exceed the force threshold (block 1012). The process then returns to block 1000. In some embodiments, the touch input may be registered or recognized by the electronic device. A touch input may be a binary input in that a state of a touch input is only one of two states; a touch input is recognized or a touch input is not recognized.

When the touch input includes an applied force that equals or exceeds the force threshold, the method continues at block 1014 where a force input is registered and an appropriate action is taken based on the force input. The method then returns to block 1000. Unlike a touch input, a force input is a non-binary input. A state of a force input can be one of a range of states (e.g., three or more states). In other words, a force input has a greater range of potential values compared to a touch input. In some embodiments, a force sensor can distinguish different forces. In such embodiments, a force may correspond to a particular action, and two difference forces can correspond to two different particular actions.

Additionally or alternatively, in some embodiments the transistor force sensitive structures can be operated in different modes or states based on the gate signal that is applied to the gate electrodes. When an electronic device includes multiple transistor force sensitive structures, some of the transistor force sensitive structures can receive one gate signal while other transistor force sensitive structures receive another gate signal. For example, in the embodiment shown in FIG. 2, the first set of transparent transistor force sensitive structures may receive a first gate signal while the second set of transparent transistor force sensitive structures receive a different second gate signal (e.g., different signal level). Additionally or alternatively, some of the transistor force sensitive structures in the first set of transparent transistor force sensitive structures may receive a first gate signal while other transistor force sensitive structures in the first set of transparent transistor force sensitive structures receive a different second gate signal. Additionally or alternatively, some of the transistor force sensitive structures in the second set of transparent transistor force sensitive structures can receive a third gate signal while other transistor force sensitive structures in the second set of transparent transistor force sensitive structures receive a different fourth gate signal.

Figure 11:
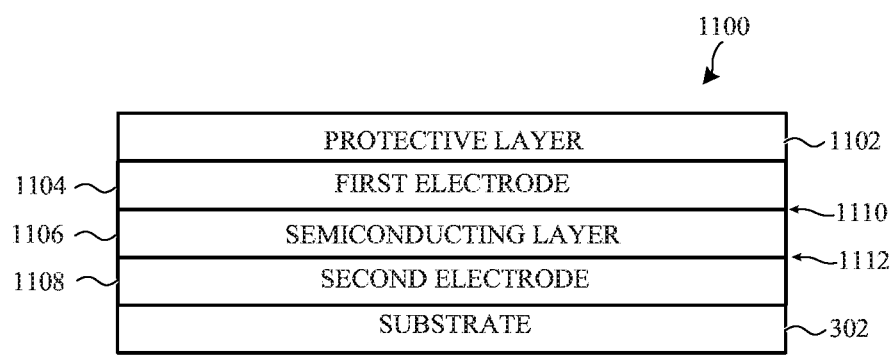
FIG. 11 shows a simplified cross-sectional view of an alternate third transparent force sensitive structure that is suitable for use in the force layer shown in FIG. 3.

FIG. 11 shows a simplified cross-sectional view of an alternate third transparent force sensitive structure that is suitable for use in the force layer shown in FIG. 3. The illustrated piezotronic transistor force sensitive structure 1100 utilizes the piezo-polarization charges at an interface between a semiconducting layer and a conductive electrode to control the transport of charge carriers across contact barriers. In the illustrated embodiment, a protective layer 1102 is positioned over a first electrode 1104 (e.g., a source electrode). A thin-film optically transparent semiconducting layer 1106 is positioned below the first electrode 1104. A second electrode 1108 (e.g., a drain electrode) is positioned between the semiconducting layer 1106 and the substrate 302. Although not shown in FIG. 11, the first and the second strain signal lines can be connected to the first and the second electrodes 1104, 1108, respectively.

As described earlier, the interfaces between the semiconducting layer 1106 and the first and second electrodes 1104, 1108 each forms a Schottky contact or barrier to charge injection and collection. The barriers are dependent on the energetics of both the semiconducting layer 1106 and the first and second electrodes 1104, 1108. Since the material in the semiconducting layer 1106 is piezoelectric, a piezopotential is produced in the semiconducting layer 1106 as the force or applied strain on the semiconducting layer 1106 changes. This piezopotential results from the polarization of the non-mobile charge carriers in the semiconducting layer 1106. The charge carrier transport process across the Schottky barrier can be controlled by the changes in polarization. For example, during a compressive strain, negative charges are induced at the interface 1110 between the semiconducting layer 1106 and the first electrode 1104 and positive charges are induced at the interface 1112 between the semiconducting layer 1106 and the second electrode 1108. The negative charges at the interface 1110 increase the barrier height. It is harder to inject carriers into the semiconducting layer 1106 with an increased barrier height. In a transistor architecture, the increased barrier height translates to a decrease in the source-drain current. Conversely, during a tensile strain, positive charges are induced at the interface 1110 and negative charges at the interface 1112. The positive charges at the interface 1110 decrease the barrier height. In a transistor architecture, the decreased barrier height translates to an increase in the source-drain current. The change in the source-drain current is measured and correlated to an amount of strain.

The first and second electrodes 1104, 1108 can be formed with any suitable optically transparent conductive material, including, but not limited to, indium tin oxide. Additionally, the thin-film optically transparent semiconducting layer 1106 can be formed with any suitable transparent semiconducting material. Example transparent semiconducting materials include, but are not limited to, a thin-film of silver nanowires or a semiconducting oxide such as zinc oxide. In some situations, the use of a semiconducting zinc oxide layer provides several advantages. Zinc oxide has a Poisson's Ratio of approximately 0.25. Zinc oxide has a high melting point and experiences small thermal expansion. Additionally, zinc oxide is compatible with micro-fabrication techniques.

Figure 12:
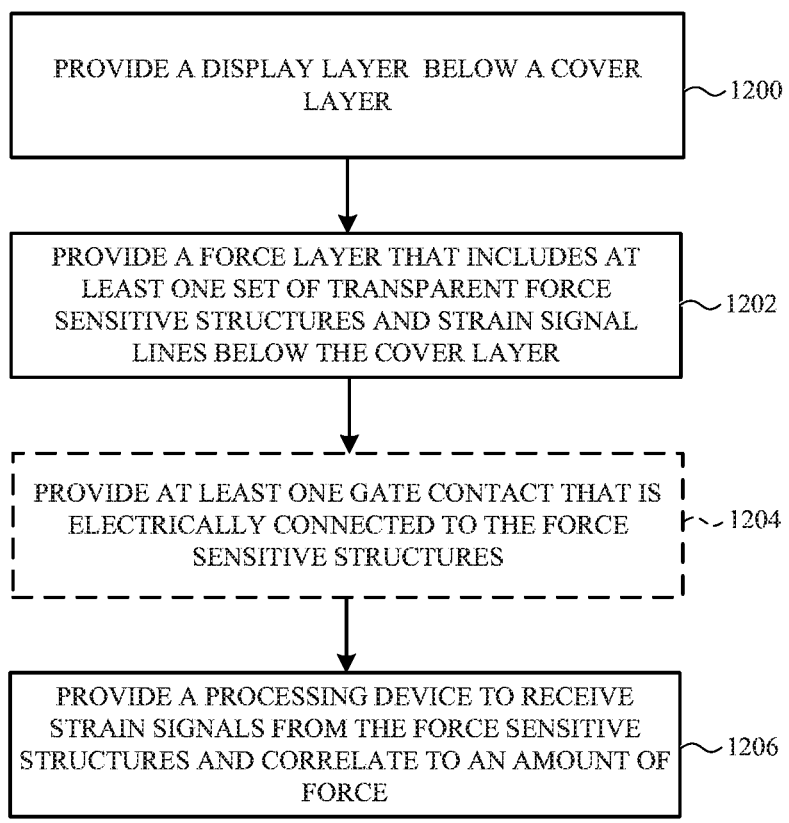
FIG. 12 shows a flowchart of a method for producing an electronic device that includes one or more transparent force sensitive structures.

FIG. 12 shows a flowchart of a method for producing an electronic device that includes one or more transparent force sensitive structures. Initially, a display layer and a force layer are provided below a cover layer (blocks 1200 and 1202). The force layer can include one or more transparent transistor (FIG. 5 and/or FIG. 6) and/or piezotronic transistor force sensitive structures (FIG. 11), along with associated strain signal lines, positioned on at least one surface of a substrate. As described earlier, in one embodiment the force layer is positioned below the display layer. In another embodiment, the force layer may be disposed above the display layer.

In embodiments that include one or more transparent transistor force sensitive structures as shown in FIGS. 5 and 6, at least one gate contact that is electrically connected to the one or more transparent force sensitive structures is provided at block 1204. Block 1204 is optional and is omitted in embodiments that do not include the transparent force sensitive structures illustrated in FIGS. 5 and 6.

Next, as shown in block 1206, a processing device is provided. The processing device is operably connected to the one or more transparent force sensitive structures. The processing device is configured to receive a strain signal from at least one transparent force sensitive structure and correlate the strain signal(s) to an amount of force.

Figure 13:
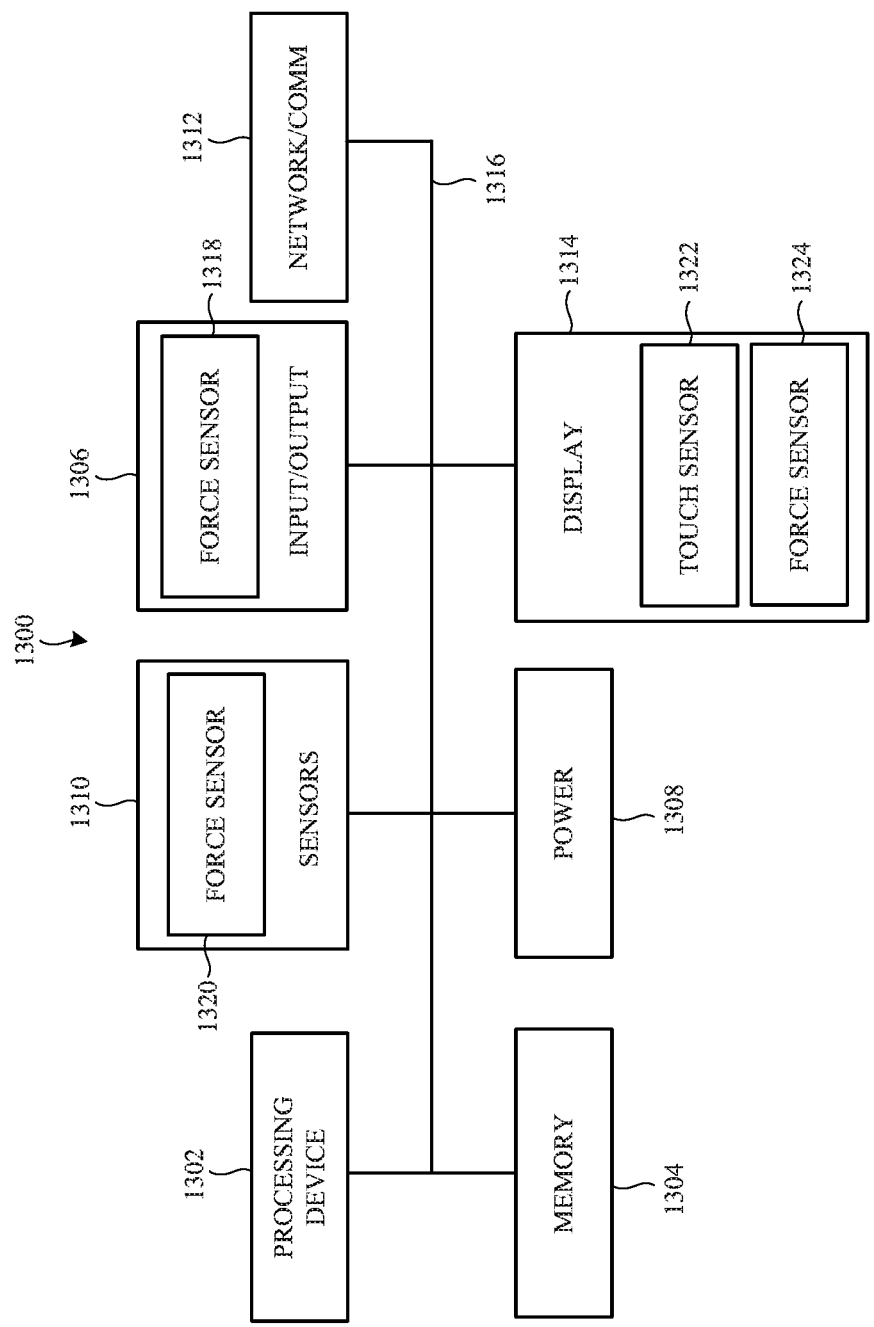
FIG. 13 shows a block diagram of an example electronic device that can include one or more transparent force sensitive structures.

FIG. 13 shows an illustrative block diagram of an electronic device that can include one or more transparent force sensitive structures. As discussed earlier, one or more transparent force sensitive structures can be located on a variety of components and/or at one or more different locations in an electronic device to detect a force applied on the component or on the electronic device. The illustrated electronic device 1300 can include one or more processing devices 1302, memory 1304, one or more input/output (I/O) devices 1306, a power source 1308, one or more sensors 1310, a network communication interface 1312, and a display 1314, each of which will be discussed in more detail.

The one or more processing devices 1302 can control some or all of the operations of the electronic device 1300. The processing device(s) 1302 can communicate, either directly or indirectly, with substantially all of the components of the device. For example, one or more system buses 1316 or other communication mechanisms can provide communication between the processing device(s) 1302, the memory 1304, the I/O device(s) 1306, the power source 1308, the one or more sensors 1310, the network communication interface 1312, and/or the display 1314. At least one processing device can be configured to determine an amount of force and/or a change in force applied to an I/O device 1306, the display, and/or the electronic device 1300 based on a signal received from one or more transistor strain sensors.

The processing device(s) 1302 can be implemented as any electronic device capable of processing, receiving, or transmitting data or instructions. For example, the one or more processing devices 1302 can be a microprocessor, a central processing unit (CPU), an application-specific integrated circuit (ASIC), a digital signal processor (DSP), or combinations of multiple such devices. As described herein, the term "processing device" is meant to encompass a single processor or processing unit, multiple processors, multiple processing units, or other suitably configured computing element or elements.

The memory 1304 can store electronic data that can be used by the electronic device 1300. For example, the memory 1304 can store electrical data or content such as audio files, document files, timing and control signals, operational settings and data, and image data. The memory 1304 can be configured as any type of memory. By way of example only, memory 1304 can be implemented as random access memory, read-only memory, Flash memory, removable memory, or other types of storage elements, in any combination.

The one or more I/O devices 1306 can transmit and/or receive data to and from a user or another electronic device. Example I/O device(s) 1306 include, but are not limited to, a touchscreen or track pad, one or more buttons, a microphone, a haptic device, a speaker, and/or a force sensor 1318. The force sensor 1318 can include one or more force sensitive structures. The force sensitive structure(s) can be configured as one of the force sensitive structures discussed earlier in conjunction with FIGS. 3-13.

As one example, the I/O device 106 shown in FIG. 1 may include a force sensor 1318. As described earlier, the force sensor 1318 can include one or more force sensitive structures that are configured according to one of the embodiments shown in FIGS. 3-12. An amount of force that is applied to the I/O device 106, and/or a change in an amount of applied force can be determined based on the signal(s) received from the force sensitive structure(s).

The power source 1308 can be implemented with any device capable of providing energy to the electronic device 1300. For example, the power source 1308 can be one or more batteries or rechargeable batteries, or a connection cable that connects the electronic device to another power source such as a wall outlet.

The electronic device 1300 may also include one or more sensors 1310 positioned substantially anywhere on or in the electronic device 1300. The sensor or sensors 1310 may be configured to sense substantially any type of characteristic, such as but not limited to, images, pressure, light, heat, force, touch, temperature, humidity, movement, relative motion, biometric data, and so on. For example, the sensor(s) 1310 may be an image sensor, a temperature sensor, a light or optical sensor, an accelerometer, an environmental sensor, a gyroscope, a magnet, a health monitoring sensor, and so on.

As one example, the electronic device shown in FIG. 1 may include a force sensor 1320 in or under at least a portion of the enclosure 102. The force sensor 1320 can include one or more force sensitive structures that may be configured as one of the force sensitive structures discussed earlier in conjunction with FIGS. 3-12. An amount of force that is applied to the enclosure 102, and/or a change in an amount of applied force can be determined based on the signal(s) received from the strain sensor(s).

The network communication interface 1312 can facilitate transmission of data to or from other electronic devices. For example, a network communication interface can transmit electronic signals via a wireless and/or wired network connection. Examples of wireless and wired network connections include, but are not limited to, cellular, Wi-Fi, Bluetooth, infrared, RFID, Ethernet, and NFC.

The display 1314 can provide a visual output to the user. The display 1314 can be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. In some embodiments, the display 1314 can function as an input device that allows the user to interact with the electronic device 1300. For example, the display can include a touch sensor 1322. The touch sensor 1322 can allow the display to function as a touch or multi-touch display.

Additionally or alternatively, the display 1314 may include a force sensor 1324. In some embodiments, the force sensor 1324 is included in a display stack of the display 1314. The force sensor 1324 can include one or more force sensitive structures. An amount of force that is applied to the display 1314, or to a cover layer disposed over the display, and/or a change in an amount of applied force can be determined based on the signal(s) received from the force sensitive structure(s). The force sensitive structure(s) can be configured as one of the force sensitive structures discussed earlier in conjunction with FIGS. 2-12.

It should be noted that FIG. 13 is exemplary only. In other examples, the electronic device may include fewer or more components than those shown in FIG. 13. Additionally or alternatively, the electronic device can be included in a system and one or more components shown in FIG. 13 is separate from the electronic device but in communication with the electronic device. For example, an electronic device may be operatively connected to, or in communication with a separate display. As another example, one or more applications or data can be stored in a memory separate from the electronic device. In some embodiments, the separate memory can be in a cloud-based system or in an associated electronic device.

Various embodiments have been described in detail with particular reference to certain features thereof, but it will be understood that variations and modifications can be effected within the spirit and scope of the disclosure. For example, the one or more strain sensors can be formed with an opaque material. Additionally or alternatively, the one or more strain sensors can be formed on one layer and the strain signal line(s) on another layer such that a strain sensor and corresponding strain signal line(s) are not co-planar (on different planar surfaces). A via can be formed through the interposing layer or layers to produce an electrical contact between the strain sensor and the strain signal lines.

What is claimed is:

1. An electronic device, comprising:
  a cover layer configured to receive a touch input;
  a display layer positioned below the cover layer;
  a force layer positioned below the cover layer and configured to detect strain based on the touch input, the force layer comprising:
    a first plurality of transistor force sensitive structures positioned over a first surface of a substrate;
    at least one first gate contact electrically connected to each transistor force sensitive structures in the first plurality of transistor force sensitive structures, the at least one first gate contact configured to receive a first gate signal to adjust a gauge factor of at least one transistor force sensitive structure by depleting charge carriers from a semiconducting layer in the at least one transistor force sensitive structure; and
  a processing device configured to receive strain signals from the first plurality of transistor force sensitive structures and configured to estimate an amount of force associated with the touch input.

2. The electronic device of claim 1, further comprising a second plurality of transistor force sensitive structures positioned over a second surface of the substrate.

3. The electronic device of claim 2, further comprising at least one second gate contact electrically connected to each transistor force sensitive structure in the second plurality of transistor force sensitive structures, the at least one second gate contact configured to receive a second gate signal to adjust a gauge factor of at least one transistor force sensitive structure in the second plurality of transistor force sensitive structures by depleting charge carriers from a semiconducting layer in the at least one transistor force sensitive structure.

4. The electronic device of claim 3, wherein the second gate signal is the same signal as the first gate signal.

5. The electronic device of claim 1, wherein the display layer is positioned over the force layer.

6. The electronic device of claim 1, wherein the display layer is positioned below the force layer.

7. The device of claim 1, wherein the force layer comprises a transparent force layer, the substrate comprises a transparent substrate, and the first plurality of transistor force sensitive structures comprises a first plurality of transparent transistor force sensitive structures.

8. An electronic device, comprising:
  a cover layer configured to receive a touch input;
  a display layer positioned below the cover layer;
  a force layer positioned below the cover layer and configured to detect an amount of strain based on the touch input, the force layer comprising:
    a first transistor force sensitive structures positioned over a first surface of a substrate, the first transistor force sensitive structure comprising:
      a first gate electrode positioned over a first semiconducting layer;
      a first source electrode at least partially positioned on a surface of the first semiconducting layer below the first gate electrode;
      a first drain electrode at least partially positioned on the surface of the first semiconducting layer below the first gate electrode;
      a first strain signal line connected to the source electrode; and
      a second strain signal line connected to the drain electrode;
  a first gate contact electrically connected to the first gate electrode, the first gate contact configured to receive a first gate signal to adjust a gauge factor of the first transistor force sensitive structure by depleting charge carriers from the first semiconducting layer; and
  a processing device configured to receive a first strain signal transmitted by the first or the second strain signal line that represents the amount of strain and configured to estimate an amount of force associated with the touch input.

9. The electronic device of claim 8, further comprising a second gate electrode positioned below the first semiconducting layer.

10. The electronic device of claim 9, wherein the first gate contact is electrically connected to the second gate electrode to adjust the gauge factor of the first transistor force sensitive structure by depleting charge carriers from the first semiconducting layer.

11. The electronic device of claim 9, wherein a second gate contact is electrically connected to the second gate electrode, the second gate contact configured to receive a second gate signal to adjust the gauge factor of the first transistor force sensitive structure by depleting charge carriers from the first semiconducting layer.

12. The electronic device of claim 8, wherein the display layer is positioned over the force layer.

13. The electronic device of claim 8, wherein the display layer is positioned below the force layer.

14. The electronic device of claim 8, wherein the first gate contact is positioned in a non-display area of the force layer.

15. The electronic device of claim 8, further comprising a second transistor force sensitive structure positioned over a second surface of the substrate, the second transistor force sensitive structure that includes:
  a third gate electrode positioned over a second semiconducting layer;
  a second source electrode at least partially positioned on a surface of the second semiconducting layer below the third gate electrode;
  a second drain electrode at least partially positioned on the surface of the second semiconducting layer below the third gate electrode;
  a third strain signal line connected to the source electrode; and
  a fourth strain signal line connected to the drain electrode.

16. The electronic device of claim 15, wherein the first gate contact is electrically connected to the third gate electrode, the first gate contact configured to receive the first gate signal to adjust a gauge factor of the second transistor force sensitive structure by depleting charge carriers from the second semiconducting layer.

17. The electronic device of claim 15, wherein a second gate contact is electrically connected to the third gate electrode, the second gate contact configured to receive a second gate signal to adjust a gauge factor of the second transistor force sensitive structure by depleting charge carriers from the second semiconducting layer.

18. The electronic device of claim 15, wherein the processing device is configured to receive a second strain signal from the third or the fourth strain signal line and configured to estimate an amount of force associated with the touch input.

19. The electronic device of claim 15, further comprising a fourth gate electrode positioned below the second semiconducting layer.

20. The electronic device of claim 19, wherein the first gate contact is electrically connected to the fourth gate electrode, the first gate contact configured to receive the first gate signal to adjust a gauge factor of the second transistor force sensitive structure.

21. The electronic device of claim 19, wherein a second gate contact is electrically connected to the fourth gate electrode, the second gate contact configured to receive a second gate signal to adjust a gauge factor of the second transistor force sensitive structure.

22. The electronic device of claim 8, wherein the substrate comprises a glass substrate.

23. The electronic device of claim 8, wherein the gate electrode and the first semiconducting layer are each formed with indium tin oxide.

24. The electronic device of claim 8, wherein the gate electrode is formed with indium tin oxide and the first semiconducting material is formed with one of a silver nanowire and a zinc oxide.

25. The electronic device of claim 8, further comprising sense circuitry operably connected between at least one of the first or the second strain signal lines and the processing device.

* * * * *